(12) United States Patent
Yamaguchi et al.

(10) Patent No.: US 12,249,600 B2
(45) Date of Patent: Mar. 11, 2025

(54) CONTACT STRUCTURES IN RC-NETWORK COMPONENTS

(71) Applicant: Murata Manufacturing Co., Ltd., Nagaokakyo (JP)

(72) Inventors: Yohei Yamaguchi, Nagaokakyo (JP); Yasuhiro Murase, Nagaokakyo (JP); Stéphane Bouvier, Cairon (FR)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 285 days.

(21) Appl. No.: 17/945,462

(22) Filed: Sep. 15, 2022

(65) Prior Publication Data

US 2023/0010467 A1 Jan. 12, 2023
US 2024/0006404 A2 Jan. 4, 2024

Related U.S. Application Data

(63) Continuation of application No. PCT/IB2021/052529, filed on Mar. 26, 2021.

(30) Foreign Application Priority Data

Mar. 26, 2020 (EP) ..................... 20305348

(51) Int. Cl.
*H01L 27/01* (2006.01)
(52) U.S. Cl.
CPC .................. *H01L 27/013* (2013.01)
(58) Field of Classification Search
CPC ................................................. H01L 27/013
(Continued)

(56) References Cited

U.S. PATENT DOCUMENTS 8,247,855 B2  8/2012  Summerfelt
2008/0121953 A1  5/2008  Summerfelt
(Continued)

FOREIGN PATENT DOCUMENTS

EP  2999002 A1  3/2016
EP  3063789  9/2016
(Continued)

OTHER PUBLICATIONS

International Search Report issued for PCT/IB2021/052529, date of mailing Jun. 18, 2021.

*Primary Examiner* — Sheng-Bai Zhu
(74) *Attorney, Agent, or Firm* — ArentFox Schiff LLP

(57) ABSTRACT

RC-network components that include a substrate and capacitor having a thin-film top electrode portion at a surface on one side of the substrate. The low ohmic semiconductor substrate is doped to contribute 5% or less to the resistance of the RC-network component. The resistance provided in series with the capacitor is controlled by providing a contact plate, spaced from the thin-film top electrode portion by an insulating layer, and a set of one or more bridging contacts passing through openings in the insulating layer. The bridging contacts electrically interconnect the thin-film top electrode portion and the contact plate. Different resistance values can be set by appropriate selection of the number of bridging contacts. The openings are elongated thereby reducing temperature concentration at their periphery. Correspondingly, the bridging contacts have an elongated cross-sectional shape.

14 Claims, 12 Drawing Sheets

(58) Field of Classification Search
USPC .......................................................... 257/533
See application file for complete search history.

(56) References Cited

U.S. PATENT DOCUMENTS

| | | | |
|---|---|---|---|
| 2012/0012982 A1* | 1/2012 | Korec | ...................... H01L 28/20 |
| | | | 257/E21.598 |
| 2013/0161792 A1* | 6/2013 | Tran | ........................ H01L 29/92 |
| | | | 438/386 |
| 2016/0087030 A1* | 3/2016 | Robutel | ............ H01L 29/66181 |
| | | | 438/387 |
| 2016/0268144 A1 | 9/2016 | Voiron et al. | |
| 2017/0104057 A1 | 4/2017 | Voiron | |

FOREIGN PATENT DOCUMENTS

| | | | |
|---|---|---|---|
| EP | 3680934 A1 | | 7/2020 |
| WO | 2015063420 A1 | | 5/2015 |
| WO | WO 2019131704 | * | 7/2019 |

* cited by examiner

FIG.4A    FIG.4B    FIG.4C
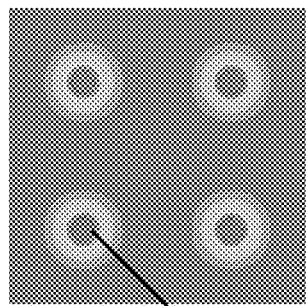  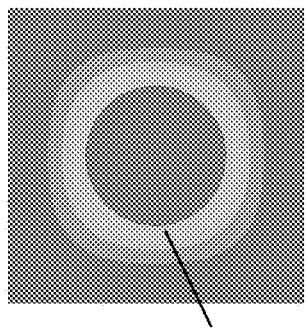  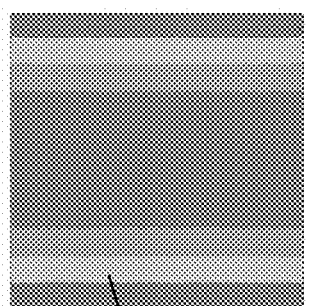
$T_{MAX}=150°C$    $T_{MAX}=84°C$    $T_{MAX}=55°C$
FIG.5A    FIG.5B    FIG.5C
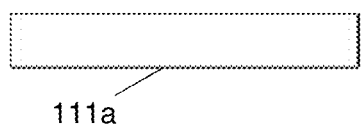  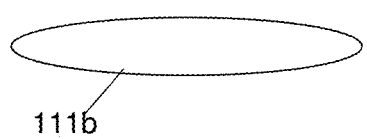  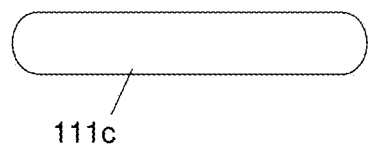
111a    111b    111c
FIG.6
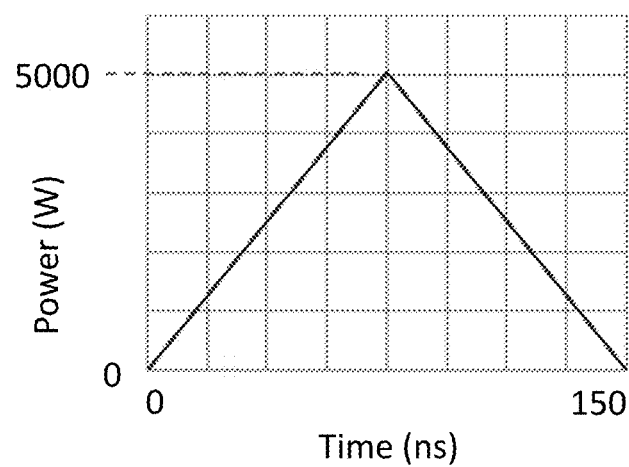

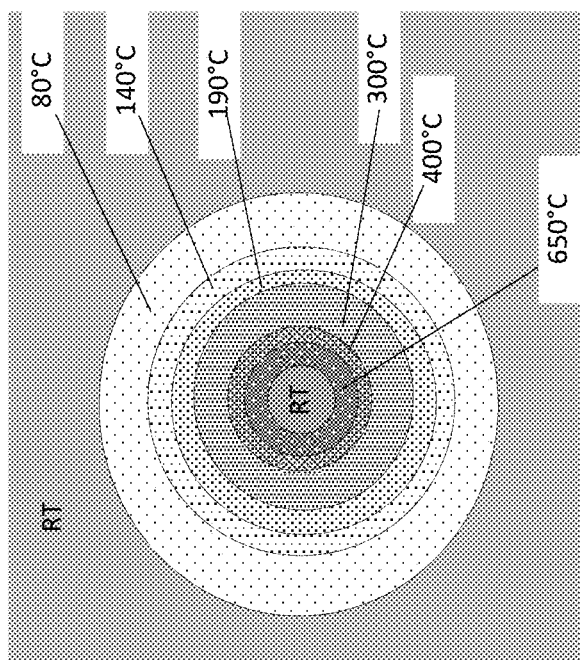
FIG. 7C
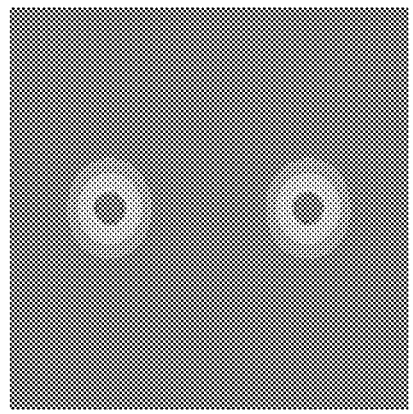
FIG. 7B
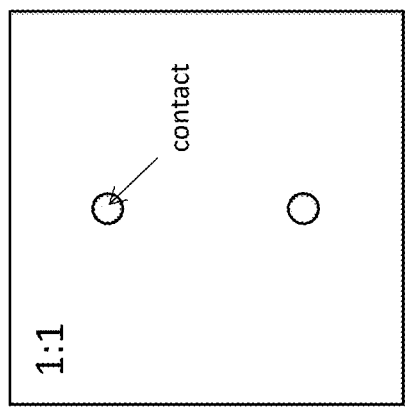
FIG. 7A

CONTACT STRUCTURES IN RC-NETWORK COMPONENTS

CROSS REFERENCE TO RELATED APPLICATIONS

The present application is a continuation of International application No. PCT/IB2021/052529, filed Mar. 26, 2021, which claims priority to European Patent Application No. EP20305348.3, filed Mar. 26, 2020, the entire contents of each of which are incorporated herein by reference.

FIELD OF THE INVENTION

The present invention relates to integrated RC-network components and, in particular, to contact arrangements in integrated RC-network components as well as to methods of their manufacture.

TECHNICAL BACKGROUND

Many electrical circuits require connection to an RC network (i.e. connection to a resistor and a capacitor that are connected in series to one another). For example, in a power electronics device a damping RC network is connected in parallel with a switch or reactance and used as a "snubber" to prevent or attenuate voltage transients (spikes) caused by rapid changes in current, to damp oscillations or overshoot due to inductive load switching, and so on. Typically, the voltage transients handled by snubbers are generated by reactances in a power circuit. The reactances may be parasitic.

RC networks can be implemented in various ways. One conventional approach for implementing an RC network consists in soldering a discrete resistor and a discrete capacitor onto a printed circuit board. A disadvantage of this first approach is that the discrete components occupy a large surface area on the mounting board. Another disadvantage is the high inductive parasitics that arise with such an arrangement.

A second approach consists in integrating an RC network with an active circuit (e.g. a power transistor) to be snubbed. In the context of automotive applications, such as fully electrical and hybrid cars, integrated RC snubbers are used to suppress electrical oscillations induced by inductive load switching (e.g. electrical motor control). These applications generate high combined constraints on this kind of component, notably: ability to withstand high temperature, ability to withstand high voltage, ability to withstand high currents, high reliability, low thickness, good thermal conductivity, and low inductive parasitic (ESL), . . . ). However, implementing integrated capacitors and resistors using regular 2D (planar) semiconductor technology has not been able to satisfy all the combined constraints discussed above, mainly because of the inability of this technology to provide the necessary high capacitance density (F/mm$^2$) in combination with the ability to withstand the necessary high operating voltage.

US2012/0012982 describes a stand-alone (monolithic) component including a 3D capacitor formed in a top surface of a substrate. A resistor may be provided in series with the 3D capacitor by setting the resistivity of the substrate to a value which makes the substrate itself constitute the desired series resistor. Contacts to the RC-network are taken at the top of the substrate (where a contact plate is laminated on the top electrode of the 3D capacitor) and at the bottom of the substrate (where a backside metallization is provided).

The latter component has a number of disadvantages. Firstly, in order to provide a range of RC-network components taking a range of values for resistance it would be necessary to employ substrates having a wide range of thicknesses and/or to employ substrates having a wide range of resistivity values. Neither of these options is acceptable in practical terms. Secondly, with current manufacturing techniques it is difficult to set the substrate's properties sufficiently precisely to guarantee a desired resistance value for the finished component. Additionally, in cases where the substrate provides appreciable resistance there can be difficulties in forming the backside metallization. Finally, in this component the resistance value is liable to change significantly with temperature.

In the applicant's co-pending European patent application EP 19 305 026.7, the whole contents of which are incorporate herein by reference, a new RC-network component has been proposed having design features that are adapted to allow a plurality of the above-mentioned combined constraints to be satisfied simultaneously. FIGS. 1A to 1C illustrate schematically the general structure of one type of integrated RC snubber described in EP 19 305 026.7, and FIGS. 1D and 1E illustrate two other types of integrated RC-network component that are also described in EP 19 305 026.7. FIG. 1F illustrates an additional structure that can be sued for an integrated RC component.

As illustrated in FIG. 1A, the RC-network component 1 has a substrate 2. At one side 2a of the substrate 2, a three-dimensional (3D) capacitor is provided comprising a dielectric layer 4 formed over a set of wells in the substrate material. A conductive material is provided over the dielectric layer 4 and has a portion 6 inside the wells as well as a plate portion 7 extending over the surface of the substrate at side 2a. The plate portion 7 constitutes the top electrode of the 3D capacitor. The top electrode of the capacitor may, for example, by made of polysilicon. An insulator layer 10 is formed over the plate portion/top electrode 7. A set of bridging contacts 8 are provided in openings 11 through the insulator layer 10. A conductive top plate 9 is provided over the insulator layer 10. The bridging contacts 8 provide a conduction path for electric current between the capacitor electrode 7 and the top plate 9.

In the example illustrated in FIG. 1A, the substrate 2 serves as the lower electrode of the 3D capacitor. A backside metallization layer 12 is provided on the substrate 2 at the side 2b thereof opposite to side 2a. Accordingly, the RC-network component 1 is a so-called "vertical" component with one contact to the series RC circuit being made on side 2a of the substrate, via the top plate 9, and the other contact being made on side 2b, via the backside metallization 2b.

FIG. 1B is an equivalent circuit diagram representing the components of the RC-network component illustrated in FIG. 1A in the case where the substrate 2 is a low ohmic (highly doped) substrate. More particularly, the substrate 2 can be configured as a low ohmic substrate such that it contributes only a small percentage (say, no more than 5% or so) of the overall resistance of the integrated RC-network component 1. The value of the overall resistance of the component is then controlled almost completely by the capacitor electrode 7 and its contact arrangement to the top plate 9. Notably, the resistance value can be adjusted via the design of the contact arrangement connected to the capacitor electrode 7, for instance by changing the number, dimensions and positioning of the bridging contacts. FIG. 1C is a perspective view of an example in which there are nine bridging contacts 8 interconnecting the thin-film capacitor electrode portion 7 and the top plate 9, and the bridging contacts are evenly distributed across the surface of the electrode 7.

In the RC-network component 1 illustrated in FIGS. 1A-1C the capacitor in the RC network is a 3D capacitor and a low ohmic substrate constitutes the bottom electrode of the capacitor. By making use of 3D capacitors (e.g. trench capacitors, or capacitors comprising dielectric and electrode layers formed over pillars/columns) the above-described integrated RC-network component can have a merit factor Capacitance Density*Breakdown Voltage that is be improved by a ratio of more than fifty compared to earlier proposals. However, other technologies may be used to implement the capacitor. Thus, for example, in the RC-network component 11 illustrated in FIG. 1D a 3D capacitor is made by depositing layers of a MIM (metal-insulator-metal) stack in the pores of a porous anodic oxide region 17 provided in a metal layer (not shown). The lower metal layer of the MIM stack is designated 13 in FIG. 1D, the insulator layer is designated 14 and the top metal layer is designated 15. Incidentally, the MIM stack may have a repeating layer structure (e.g. MIMIM, MIMIMIM, etc.).

As an example, the metal layer may be an aluminum layer and the anodic oxide may be aluminum oxide made by anodization of a selected region in the aluminum layer. The pores of the anodic oxide region 17 may extend all the way through the metal layer so that the inside of each pore communicates with an underlying conductive layer 16. In certain implementations, the conductive layer 16 and the overlying metal layer are formed on a substrate 19 before the anodization process is performed. To enable the bottom terminal of the RC-network component 11 to be provided at the bottom of the structure, a conductive layer 12, serving as the bottom contact, may be provided and electrical contact between the bottom electrode of the 3D capacitor is achieved via a conductor 18 passing through the substrate 19. If desired, lateral isolation bands (not shown), made of electrically-insulating material, may be provided through the conductive layer 16, and this facilitates the integration of additional components in the device, either to the left and/or right sides of the 3D capacitor illustrated in FIG. 1D, or in additional layers above or below the illustrated structure. Further information regarding how to fabricate a 3D capacitor in the pores of a porous anodic oxide region, and regarding techniques for integration of additional components, may be found in the Applicant's earlier application EP 3 063 789.

As another example of variation in the design of the capacitor, FIG. 1E illustrates an RC-network component 21 in which the capacitor is a planar capacitor having a bottom electrode 27 formed on the substrate 2, a dielectric layer 4a and a top electrode layer 7. A first contact to the series RC component is made on side 2a of the substrate, via the top plate 9, and the other contact to the series RC component may be made through the substrate, for example on side 2b via a backside metallization (not shown).

The example illustrated in FIG. 1F illustrates a structure similar to that of FIG. 1A but configured as a so-called "horizontal" component in which both contacts to the RC component are both provided on the same side of the substrate. A first contact to the series RC circuit is made on side 2a of the substrate, via the top plate 9, and the other contact is made through the substrate 2, also on side 2a of the substrate, at a contact 12'.

The components illustrated in FIGS. 1D-1F make use of distributed bridging contacts 8 and a contact plate 9 so as to set the resistance of the overall RC-network component to a desired value, as in the RC-network component 1 of FIGS. 1A-1C.

An explanation shall now be given, with reference FIGS. 2A to 2C, regarding how the use of the contact structure involving the contact plate 9 and the set of bridging contacts 8 enables the resistance of the above-described RC-network components 1, 11, 21 to be adjusted. For the purposes of the discussion of FIGS. 2A-2C, it is assumed that the capacitor-electrode portion 7 has a square peripheral shape.

When the electrical properties of a thin film or plate of material are discussed it is common to refer to the sheet resistance of the film/plate. As is well known, the sheet resistance of a material is a quantity that is quoted in Ohms per square, and the electrical resistance of a sheet of a specific material is calculated according to the following relation:

$$R = R_s \frac{L}{W}$$

where R is the electrical resistance provided by the sheet, Rs is the sheet resistance of the material forming the sheet, L is the length of the sheet and W is the width of the sheet. Thus, it can be understood that, provided that different sheets of a specific material are all square (i.e. L/W=1), these sheets will all have the same electrical resistance, irrespective of whether the sheets are of the same size. The RC-network components of FIGS. 1A-1E exploit this property.

FIG. 2A illustrates a simplified electrical model of the capacitor electrode portion 7 (made of resistive polysilicon), in which Rsq_poly represents the sheet resistance of this polysilicon thin film 7. Rsq_poly is a function of the resistivity of the material, and of its thickness.

FIG. 2B then represents a very simplified electrical model of the case where the capacitor and a single metal contact are added to FIG. 2A. It can be understood that the resistive access to the capacitor (or equivalent series resistance, ESR) is a function of the sheet resistance of the polysilicon layer 7, i.e. ESR=f (Rsq_poly).

However, if the number of contacts is increased to a number N, as illustrated by the simplified electrical model of FIG. 2C, the polysilicon thin film 7 is notionally sub-divided into N smaller polysilicon squares sheets each having the same resistance value. If the N contacts are then connected together by a very low resistive plate (metal plate), i.e. the contact plate 9, the N smaller polysilicon squares will be virtually connected in parallel. Accordingly, the ESR becomes a function of the sheet resistance of layer 7 divided by the number N of bridging contacts 8, i.e. ESR=f (Rsq_poly/N).

Thus, the resistance of an RC-network component as illustrated in FIGS. 1A-E can be adjusted by varying the number N of bridging contacts interconnecting the contact plate 9 to the capacitor-electrode layer 7. This can be easily realized by adding the isolation layer 10 (e.g. made of $SiO_2$) between the two layers 7, 9 and performing a simple patterning process to form holes in which the bridging contacts can be provided.

The above analysis is applicable in cases where the top plate-shaped electrode 7 of the capacitor is a thin film, that is, the thickness of the top plate-shaped electrode 7 is much less that the length of the bridging contacts. Typically, in an RC-network component as illustrated in FIGS. 1A-E the thin-film plate-shaped capacitor top electrode is made of polysilicon and is less than 5 micrometers thick. In certain preferred embodiments of the invention the thin-film plate-shaped capacitor top electrode is made of polysilicon and is less than 1 micrometer thick.

RC-network components as illustrated in FIGS. 1A-1F provide a number of advantages, such as:

Ability to withstand high currents (several amps or tens of amps): the inrush current is divided between the N contacts. Furthermore, there is a quasi-vertical current path in the thin capacitor-electrode layer 7.

Ability to withstand significant voltage levels (several tens or hundreds of volts).

Small footprint: the surface area occupied by the component is small irrespective of the resistor value.

Low thickness: the thickness of the RC-network component can be as low as that of a power transistor (e.g. 50 µm) and the thickness does not need to change as the resistance value changes.

A variety of resistance values can be achieved using just one value for wafer resistivity (preferably, highly doped) simply by changing the contact arrangement at the top of the substrate.

Low process overhead for resistance variability: the resistance value may be programmed simply by 1 mask modification (contact opening).

Versatile wiring arrangements: wiring is possible on the 4 sides of the architecture.

Low temperature drift of the resistance (of the order of a few 100 s of ppm/K. This is a significant consideration for RC-network components that are applied as snubber networks, because snubbers absorb energy during operation, heat up, and often need to withstand relatively large temperature ranges, for example from room temperature up to around 200° C.).

A well-controlled resistance value of the resistor included in the RC network (<10% variation from the target value).

Standard processes can be used for backside metallization (in the case of using a highly-doped silicon substrate).

In cases where the RC-network components constitute RC snubbers:

there is a good response of the snubber network to signals which have fast rise times, and the contact layout facilitates low inductivity connection of the snubber to the circuit being snubbed, thus avoiding decoupling of the snubber's resistor by parasitic inductance of the interconnection line.

The resistance value could also be changed by changing the dimensions (cross-sectional area, length) of the bridging contacts. However, typically the dimensions of the bridging contacts are set based on the desired current-handling capacity of the device, and then the resistance value is set by selecting an appropriate number of bridging contacts. Likewise, the resistance value could be changed by changing the dimensions of the contact plate 9. However, in general, the dimensions of the contact plate 9 are set in view of constraints relating to assembly.

In principle the locations of the bridging contacts 8 could be distributed over the surface area of the thin-film top electrode 7 of the capacitor in an uneven manner. This would have only a small impact on the resistance value observed at low frequencies. However, at higher frequencies such an uneven distribution of the bridging contacts 8 could lead to unpredictable variation in the value of resistance. In contrast, consistent frequency behavior is observed in the case where the bridging contacts 8 are provided at locations that are evenly distributed over the surface area of the thin-film top electrode of the capacitor. Thus, for example, the area of the top electrode may be notionally divided up into squares and bridging contacts 8 may be positioned, respectively, at the centers of the squares. However, other even distributions may be used, for example, the bridging contacts may be positioned on concentric circles, evenly spaced from each other.

It has been found that an undesired temperature-concentration phenomenon may occur during use of the integrated RC-network components illustrated in FIGS. 1A to 1F, in the case where a current surge takes place. This phenomenon will now be described with reference to FIGS. 3A and 3B.

It has been observed that when a power pulse is applied to a contact arrangement such as that at the top of the components illustrated in FIGS. 1A to 1F, wherein bridging contacts in small openings interconnect a capacitor top electrode to an upper plate, the periphery of the opening heats up to a high temperature and the component may fail.

FIGS. 3A and 3B serve to illustrate the results of simulations that were performed to estimate the transient temperature rise at the periphery of the openings in a case where a rectangular wave is applied. These simulations modelled temperature rise in a structure including a lower layer (corresponding to the thin-film top electrode portion) connected to a metal upper plate by a set of four bridging contacts. The simulations involved a transient thermal analysis performed using the finite element method. The simulations modelled the case where a rectangular wattage pulse having a peak power level of 2000W and a duration of 150 ns was applied to the structure illustrated in FIG. 3A in which each bridging contact had a square cross-sectional shape.

The example illustrated by FIGS. 3A-3B concerns an RC-network component of the same general type as that illustrated in FIG. 1A. In this example, the substrate 2 is made of Si doped to have resistivity in the range 1 to 5 mΩ.cm. The capacitor dielectric layer 4 is made of ONO (i.e. a layered structure formed of $SiO_2/SiN/SiO_2$). The capacitor top electrode is made of polysilicon. The insulator layer 10 is made of $SiO_2$. The bridging contacts 8 and the top plate 9 are made of Al—Si—Cu. The component also includes additional layer 22 made of SiN which serves to improve moisture resistance. If desired, additional layers may be provided in the structure, for example an additional $SiO_2$ layer may be provided underneath the layer 22.

During a transient surge the inrush current is divided between the bridging contacts and then spreads horizontally in all directions in the portion of the capacitor-electrode layer 7 connected to each bridging contact, as illustrated by the arrows marked in FIG. 3A. However, it has been found in the simulations that there is a concentration of current at the periphery of the openings in the insulator layer 10 through which the bridging contacts 8 pass, at the locations marked by crosses, and this can lead to significant undesired heating.

FIG. 3B illustrates the results of a simulation that was performed in relation to an example contact arrangement in which four bridging contacts 8 were provided to interconnect the thin-film capacitor-electrode portion 7 to the top plate 9. In the example, each bridging contact 8 had a square cross-sectional shape, and the four bridging contacts were distributed evenly across the surface of the top plate 9.

As can be seen from FIG. 3B, the temperature in the vicinity of each bridging contact can become extremely high. Indeed, a maximum temperature of 348° C. was reached at the corners of each bridging contact (in other words, at the corners of each square opening through the insulating layer 10). Such high temperatures could damage or destroy the RC-network component during use.

In order to ensure that the RC-network component is not damaged or destroyed during use, because of such high temperatures, it can be contemplated to increase the diameter of the openings 11 in the insulating layer 10. However, this leads to a reduction in the resistance of the RC-network component and often it is desirable to be able to maintain a high value for the RC-network component's resistance.

The present invention has been made in the light of the problems discussed above.

SUMMARY OF THE INVENTION

The present invention provides an integrated RC-network component comprising:
a substrate,
a capacitor having a thin-film top electrode portion at a surface on a first side of the substrate,
an insulating layer provided on the thin-film top electrode portion of the capacitor,
a contact plate provided on the insulating layer, and
a set of one or more bridging contacts provided in openings traversing the insulating layer, the bridging contacts electrically connecting the thin-film top electrode portion of the capacitor to the contact plate;
wherein the RC-network component has first and second contacts, the first contact comprising said contact plate, and a series RC circuit is constituted between the first and second contacts;
characterized in that:
the substrate is a low ohmic semiconductor substrate doped to make a contribution of no more than 5% to the resistance of the RC-network component; and
the openings have an elongated peripheral shape that has an aspect ratio greater than 1:1.

In view of the fact that the substrate is a low ohmic semiconductor substrate doped to make a contribution of no more than 5% to the resistance of the RC-network component, the resistance of the RC-network component is substantially set by the contact arrangement at the first side of the substrate. The resistance value can be set with a relatively high degree of precision by control of the contact arrangement at said first side of the substrate and there is relatively low change in the resistance value as temperature changes while also obtaining a high capacitance value.

It has been found that use of an elongated shape for the periphery of the openings in the insulating layer/cross-sectional shape of the bridging electrodes decreases the current density and this results in reduction of the temperature concentration at the periphery of the openings. Accordingly, a desired high value of resistance can be obtained without undue temperature rises at the openings in the insulating layer when transient current surges occur through the RC-network component. In certain preferred embodiments of the invention the openings have an elongated peripheral shape that has an aspect ratio greater than 2:1, producing a longer perimeter for the openings and an increased effect in reducing current concentration.

The openings in the insulating layer may have various types of elongate shapes, for example a rectangular peripheral shape, an elliptical peripheral shape, and so on. In some embodiments the openings take the form of a pair of elongated, primarily linear, openings spanning across substantially the whole width of the thin-film top electrode portion of the capacitor. In such cases, because the current flows out into the thin-film top electrode portion of the capacitor long a line, there is no local concentration of heat.

The equivalent series resistance at the first side of the substrate may be proportional to the sheet resistance of the thin-film top electrode portion divided by the number of bridging contacts in the case where, in the direction of the thickness of the thin-film top electrode portion of the capacitor, the length of the bridging contacts is sufficiently greater than the thickness of the thin-film top electrode portion. Accordingly, in such cases the ESR can be set by control of the number of bridging electrodes.

In some embodiments of the invention the bridging contacts are made of a material having conductivity greater than that of the material forming the top capacitor electrode. In some cases, the bridging contacts and the contact plate are integrally formed of the same material, which facilitates manufacture.

In certain embodiments of the invention, the thin-film electrode portion of the capacitor is made of polysilicon. In this case there is low variation in the resistance of the component as the temperature changes.

In certain embodiments of the invention, the contact plate and the top electrode portion of the capacitor have the same peripheral shape. In some cases, the contact plate and the top electrode portion of the capacitor have the same size.

In certain embodiments of the invention, the capacitor is a 3D capacitor and electrical contact to the bottom electrode of the capacitor is made through the low ohmic substrate. In the case where contact to the bottom electrode of the capacitor is made through the substrate, the substrate makes a reduced contribution to the overall resistance of the RC-network component in the case where it is a low ohmic substrate. This enables control of the resistance of the RC-network component to be exercised primarily by control of the properties of the bridging contacts.

In certain embodiments of the invention, the only part of the capacitor top electrode to be located at said surface on the first side of the substrate is a single planar sheet constituting said thin-film top electrode portion.

The skilled person will readily understand that RC-network components according to different embodiments of the invention may be implemented as monolithic (standalone) RC-network components, notably as monolithic components in which transistors, inductors and other such component structures have not been fabricated in addition to the RC-network. In other words, RC-network components according to the invention may be constructed as monolithic RC-network components independently of other device features, for instance independently of: the specific configuration (aspect ratio, number, shape, etc.) of the openings in the insulating layer in which the bridging contacts are disposed, the specific configuration of the capacitor (3D, planar), and so on.

The present invention further provides a method of fabricating an RC-network component, comprising:
forming a capacitor having a thin-film top electrode portion at a surface on a first side of a substrate;
forming an insulating layer on the thin-film electrode portion of the 3D capacitor;
forming a set of one or more bridging contacts traversing openings in the insulating layer; and
forming a plate-shaped contact on the insulating layer;
wherein the set of bridging contacts electrically connect the thin-film top electrode portion of the capacitor to the plate-shaped contact;

wherein the RC-network component has first and second contacts, the first contact comprising said contact plate, and a series RC circuit is constituted between the first and second contacts;

characterized in that:

the substrate is a low ohmic semiconductor substrate (102) doped to make a contribution of no more than 5% to the resistance of the RC-network component; and the openings in the insulating layer have an elongated peripheral shape that has an aspect ratio greater than 1:1.

This fabrication method makes it possible to set the nominal resistance value of the RC-network component to a desired value, selected in a wide range, simply by choosing how many contacts to include in the set of bridging contacts, and a desired resistance value can be obtained while avoiding an undue temperature rise when a current surge occurs through the component.

According to embodiments of the invention, the logistical challenge involved in manufacturing components having different resistance values is greatly reduced. For example, in a case where the bridging contacts are formed by using a photolithographic process to create via holes in the insulating layer and then filling the via holes with a conductive material, the resistance value can be changed simply by swapping the mask used in the photolithographic process.

BRIEF DESCRIPTION OF THE DRAWINGS

Further features and advantages of the present invention will become apparent from the following description of certain embodiments thereof, given by way of illustration only, not limitation, with reference to the accompanying drawings in which:

FIGS. 1A-1F illustrate examples of an integrated RC-network component described in the applicant's co-pending European patent application EP 19 305 026.7, to which the present invention can be applied, in which:

FIG. 1A represents a cross-section through an example of a first type of integrated RC-network component, FIG. 1B represents an equivalent circuit to the FIG. 1A structure, FIG. 1C shows a perspective view schematically illustrating an example arrangement of bridging contacts in the RC-network component of FIG. 1A, FIG. 1D illustrates an example of a second type of integrated RC-network component described in the applicant's co-pending European patent application EP 19 305 026.7, FIG. 1E illustrates an example of a third type of integrated RC-network component described in the applicant's co-pending European patent application EP 19 305 026.7, and FIG. 1F illustrates an example of a fourth type of integrated RC-network component;

FIGS. 3A and 3B illustrate a temperature-concentration phenomenon observed in RC-network components of the types illustrated in FIGS. 1A-1F, in which:

FIG. 3A illustrates how current flows in an integrated RC-network component of the general type illustrated in FIG. 1A, and FIG. 3B illustrates the results of a simulation of the temperature exhibited in the vicinity of an example arrangement of bridging contacts in an RC-network component of the type illustrated in FIG. 3A;

FIGS. 4A-4C are diagram to illustrate how contact arrangements that may be applied in RC-network components of the types illustrated in FIGS. 1A-1E, and all providing the same resistance value, alter the temperature concentration phenomenon illustrated by FIGS. 3A-3C, in which:

FIG. 4A illustrates an arrangement using four circular openings (to house the bridging contacts), FIG. 4B illustrates an arrangement using one large annular opening, and FIG. 4C illustrates an arrangement using two elongated openings;

FIGS. 5A-5C illustrate some different peripheral shapes of openings containing bridging contacts according to embodiments of the invention, in which:

FIG. 5A represents an opening having a rectangular peripheral shape,

FIG. 5B represents an opening having an elliptical peripheral shape, and

FIG. 5C represents an opening having a peripheral shape combining linear portions and curved portions;

FIG. 6 illustrates a wattage pulse (power pulse) used in simulations in which the aspect ratio;

FIGS. 7A-7C illustrate the maximum transient temperature produced in simulations wherein the power pulse of FIG. 6 was applied to a contact structure in which the aspect ratio of the openings was 1:1, in which FIG. 7A represents the contact structure, FIG. 7B illustrates the maximum transient temperature developed in the structure, and FIG. 7C is an enlarged diagrammatic view of FIG. 7B;

FIGS. 8A-8C illustrate the maximum transient temperature produced in simulations wherein the power pulse of FIG. 6 was applied to a contact structure in which the aspect ratio of the openings was 1:2, in which FIG. 8A represents the contact structure, FIG. 8B illustrates the maximum transient temperature developed in the structure, and FIG. 8C is an enlarged diagrammatic view of FIG. 8B;

FIGS. 9A-9C illustrate the maximum transient temperature produced in simulations wherein the power pulse of FIG. 6 was applied to a contact structure in which the aspect ratio of the openings was 1:5, in which FIG. 9A represents the contact structure, FIG. 9B illustrates the maximum transient temperature developed in the structure, and FIG. 9C is an enlarged diagrammatic view of FIG. 9B;

FIGS. 12A and 12B illustrate an RC-network component according to an embodiment of the invention that makes use of a pair of openings, for bridging contacts, that span the width of the thin-film top electrode plate of the capacitor, in which:

FIG. 12A is a plan view, and

FIG 12B is a cross-sectional view along the line B-B' of FIG. 12A;

DETAILED DESCRIPTION OF EXAMPLE EMBODIMENTS

The present inventors have determined a way of mitigating the above-described undesired temperature-concentration phenomenon that may occur during use of the integrated RC-network components illustrated in FIGS. 1A-1F. More particularly, the inventors have determined that the transient temperature rise that is seen when a current surge passes through such RC-network components can be decreased by changing the shape of the openings through the insulating layer (with a corresponding change in the peripheral shape of the bridging contacts).

FIGS. 4A-4C show the results of simulations that were performed to estimate the transient temperature rise that would occur in the case of a power pulse passing through structures having different contact arrangements and, specifically, bridging contacts provided in openings having different shapes. In each case the resistance of the overall structure is the same. These simulations modelled temperature rise in a structure including a lower layer (corresponding to the thin-film top electrode portion) connected to a metal upper plate by a set of bridging contacts. The simulations involved a transient thermal analysis performed using the finite element method. The simulations modelled the case where a triangular wattage pulse having a peak power level of 2000W and a duration of 150 ns was applied to each illustrated contact structure.

Figure 1A:
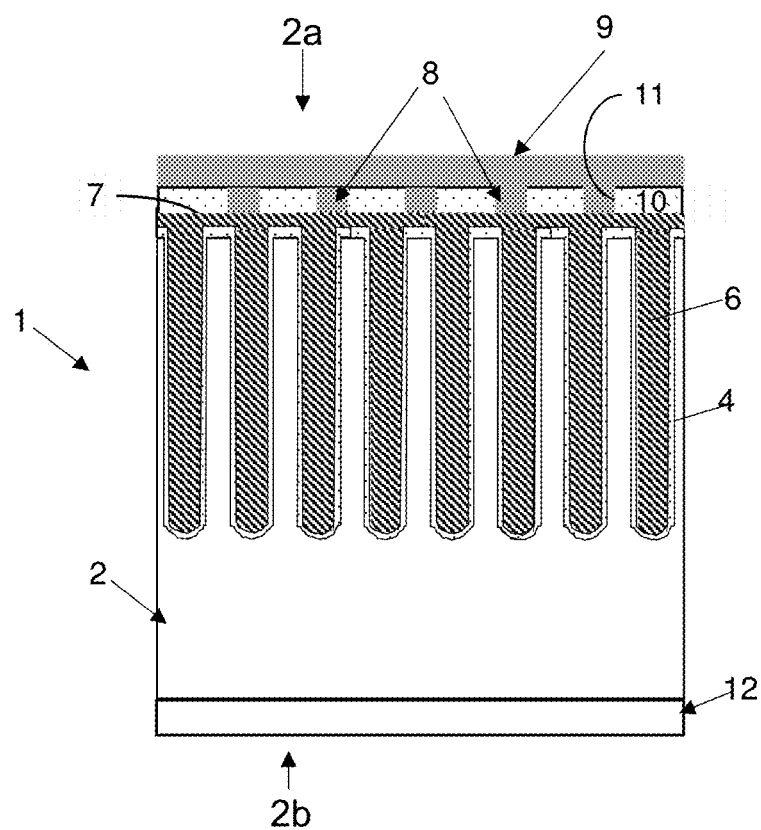
Figure 1B:
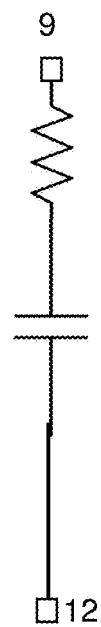
Figure 1C:
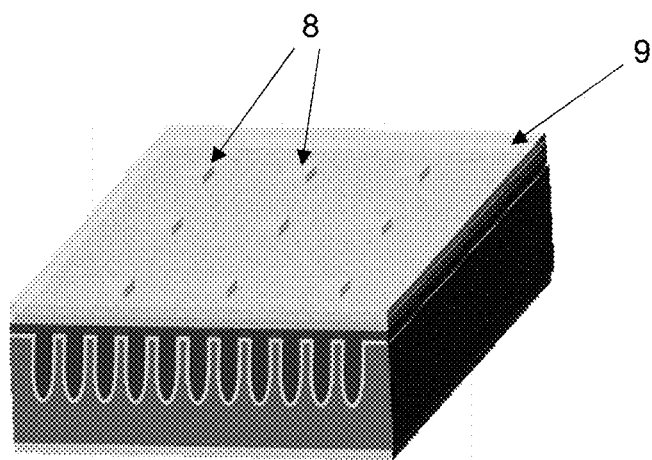
Figure 1D:
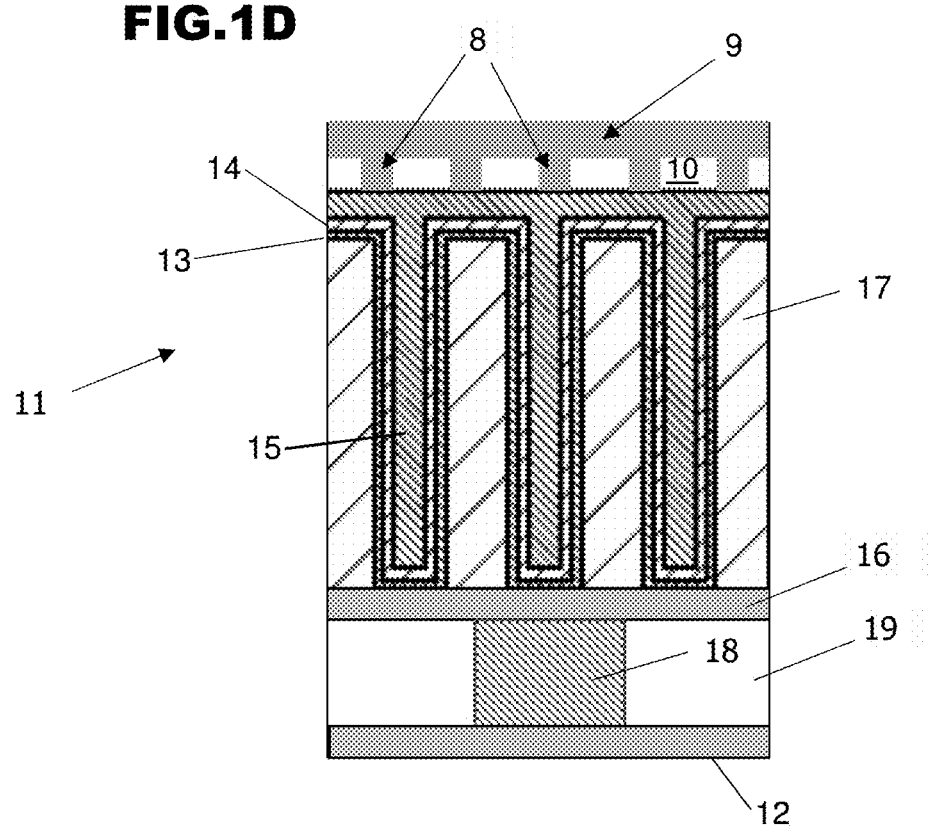
Figure 1E:
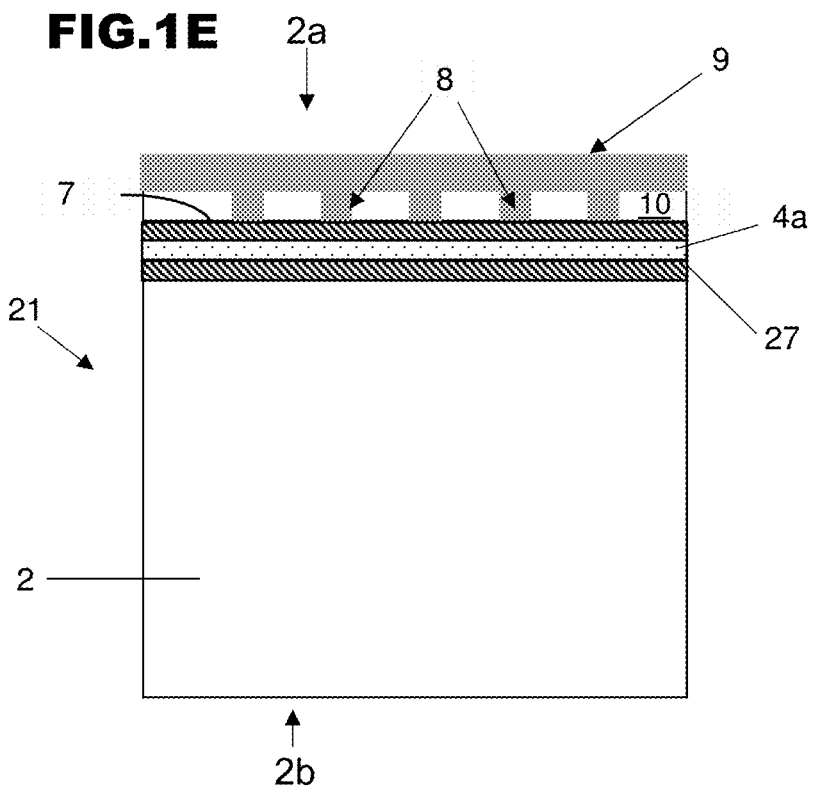
Figure 2A:
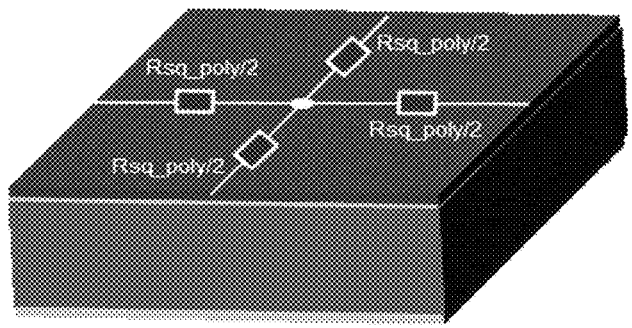
FIGS. 2A to 2C illustrate how the equivalent series resistance at the top contact of the RC-network component of FIGS. 1A-1F can be modulated by varying the number of bridging contacts between a thin-film top electrode portion of the capacitor and a contact plate.
Figure 2B:
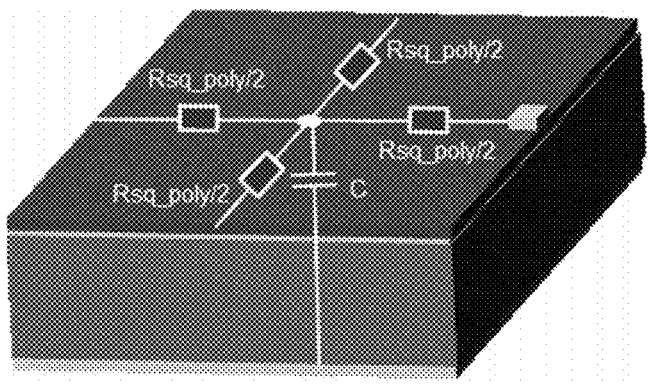
Figure 2C:
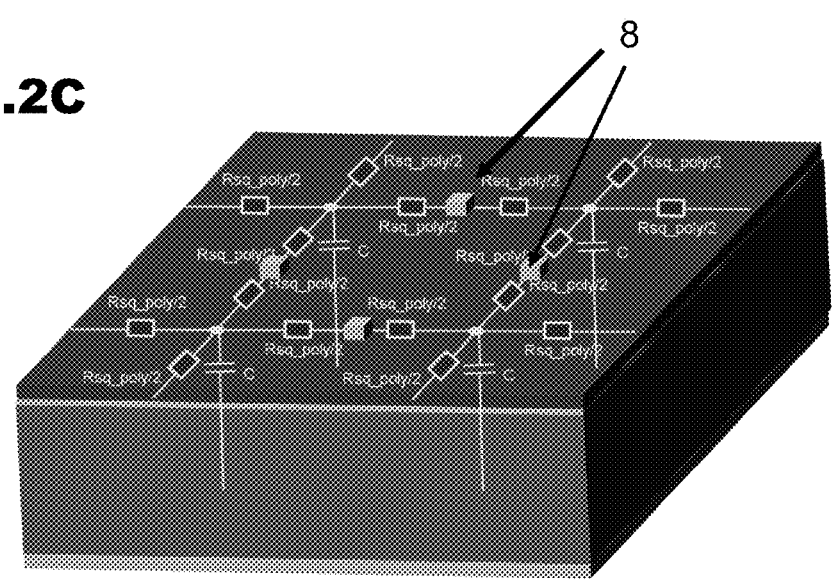
Figure 3A:
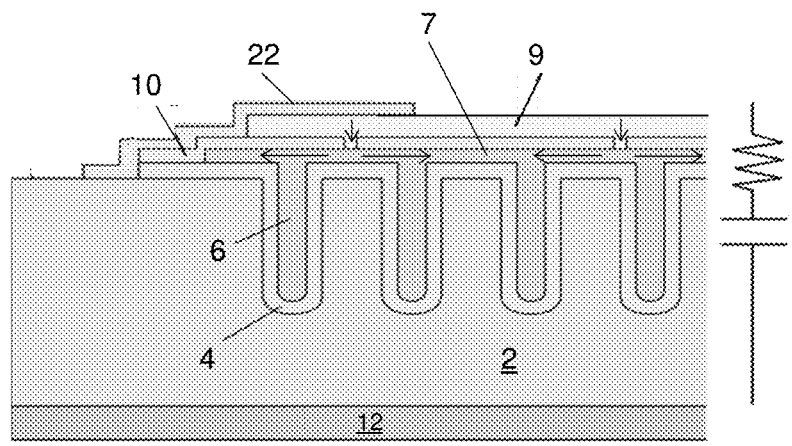
Figure 3B:
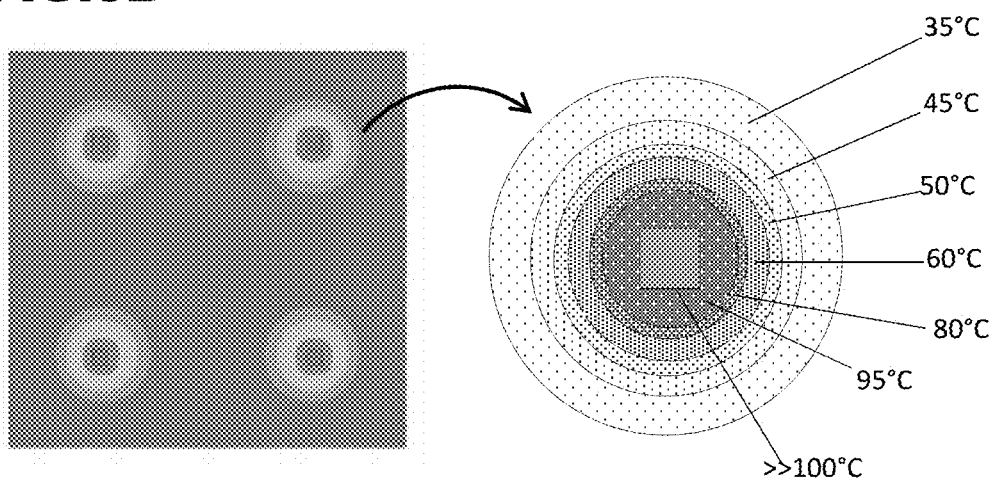
Figure 1F:
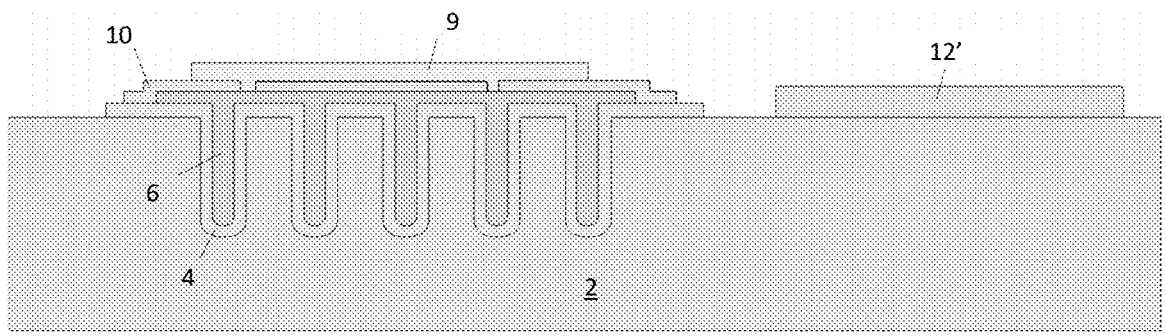

FIG. 4A illustrates a simulation result obtained in a case where the four square openings shown in FIG. 3A are replaced by four circular openings.

FIG. 4B illustrates a simulation result obtained in a case where the four square openings shown in FIG. 3A are replaced by a single annular opening having a larger diameter.

FIG. 4C illustrates a simulation result obtained in a case where the four square openings shown in FIG. 3A are replaced by two rectangular openings spanning the thin-film top electrode portion of the capacitor.

It can be seen from FIGS. 4A-4C that the maximum transient temperature reached in the vicinity of the openings in the insulating layer, upon occurrence of a current surge, is considerably reduced in the case where the openings have an elongated shape as in FIG. 4C. It is understood that use of an elongated shape increases the peripheral length of each opening and decreases the current density at each point along the periphery of the openings. Accordingly, in embodiments of the invention the aspect ratio of the openings is set greater than 1:1 (i.e. the opening has a peripheral shape whose dimensions are different in the vertical and horizontal directions thereof). By making the openings different in length and width, the peripheral length becomes longer than that of square or circular openings of the same area, and the current density can be reduced, while still attaining the same value of resistance.

Various embodiments of the invention employ openings having different peripheral shapes. Thus, openings 111a having a rectangular peripheral shape as illustrated in FIG. 5A can be used in certain embodiments. Certain other embodiments of the invention employ openings which lack sharp corners, for example openings 111b having an elliptical peripheral shape as illustrated in FIG. 5B, or openings 111c as represented in FIG. 5C whose peripheral shape combines a pair of substantially parallel linear portions joined at their ends by respective curved portions.

In certain embodiments of the invention, the peripheral shape of the opening has at least one extended linear portion. Accordingly, at the linear portion, the points where the current flows out into the thin-film top electrode portion of the capacitor lie along a straight line and, accordingly, there is no local heat concentration.

Simulations have been performed to determine how the temperature that is developed in the contact structure changes as the aspect ratio of the openings changes (i.e. as the aspect ratio of the peripheral shape of the openings containing the bridging contacts changes). FIG. 6 shows the power pulse that was applied in these simulations. It can be seen that it is a triangular power pulse that rises linearly from 0W to a peak at 5000W then decreases linearly back down to 0V, over a time period of 150 ns.

FIGS. 7-9 illustrate the maximum transient temperature that was produced in the simulations when the power pulse of FIG. 6 was applied to three different contact structures having aspect ratios of 1:1, 1:2 and 1:5, respectively. Regions in the structure that are at room temperature (approximately 25° C.) are labelled RT in FIGS. 7-9.

FIG. 7A represents a first contact structure including two openings each having aspect ratio of 1:1. The openings are circular in this example. FIG. 7B illustrates the maximum transient temperature developed in the structure of FIG. 7A, and FIG. 7C is an enlarged diagrammatic view of FIG. 7B. It can be seen that a maximum transient temperature of 640° C. is reached at the periphery of each opening in this first contact structure.

Figure 8A:
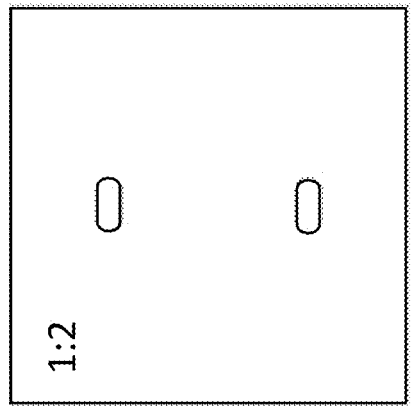
Figure 8B:
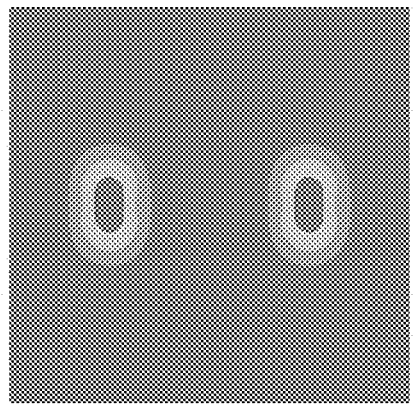
Figure 8C:
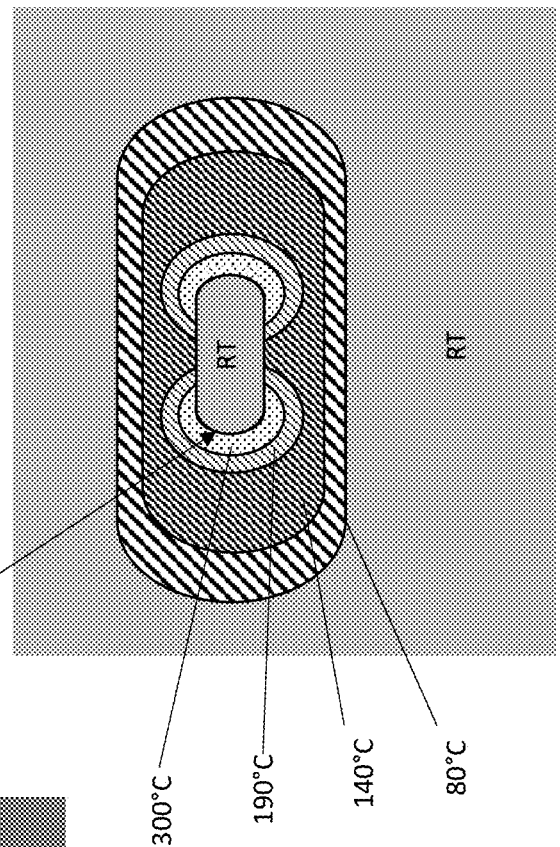

FIG. 8A represents a second contact structure including two openings each having aspect ratio of 1:2. In this example the openings are generally elliptical in shape, and have a short linear portion and curved portions at the ends. FIG. 8B illustrates the maximum transient temperature developed in the structure of FIG. 8A, and FIG. 8C is an enlarged diagrammatic view of FIG. 8B. It can be seen that a maximum transient temperature of 500° C. is reached at the periphery of each opening in this second contact structure.

Figure 9C:
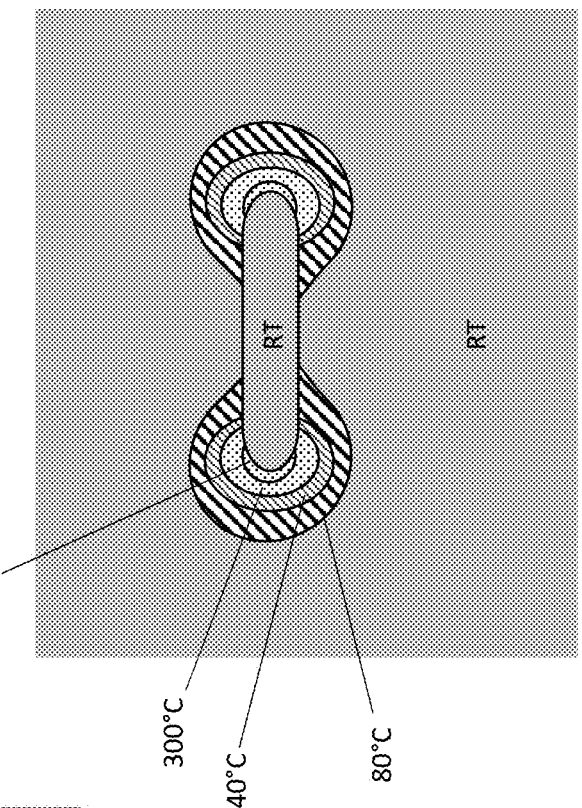
Figure 9B:
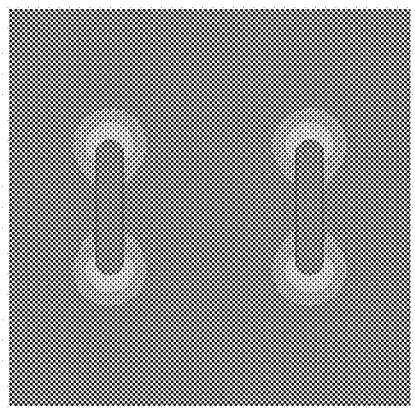
Figure 9A:
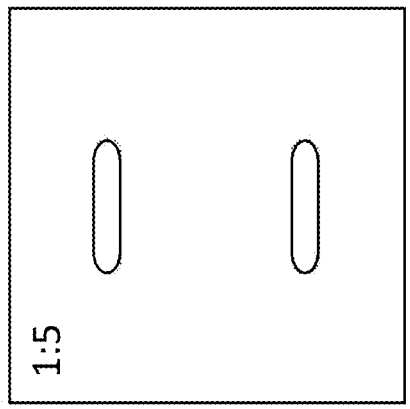

FIG. 9A represents a third contact structure including two openings each having aspect ratio of 1:5. In this example the openings are generally elliptical in shape, and have a longer linear portion with curved portions at the ends. FIG. 9B illustrates the maximum transient temperature developed in the structure of FIG. 9A, and FIG. 9C is an enlarged diagrammatic view of FIG. 9B. It can be seen that a maximum transient temperature of 430° C. is reached at the periphery of each opening in this third contact structure.

Figure 10:
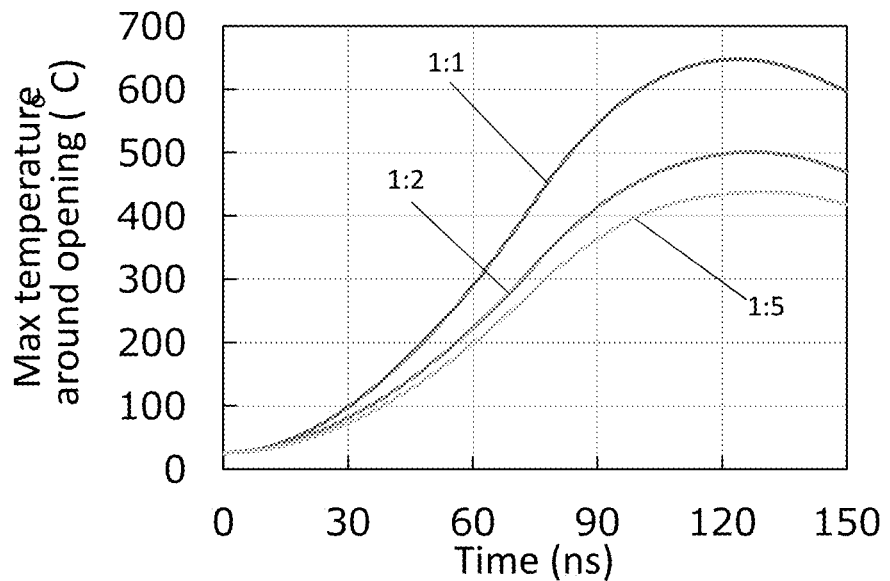
FIG. 10 is a graph showing how maximum transient temperature varied over time during the simulations of FIGS. 6-9, for the contact structures having different aspect ratios.
Figure 11:
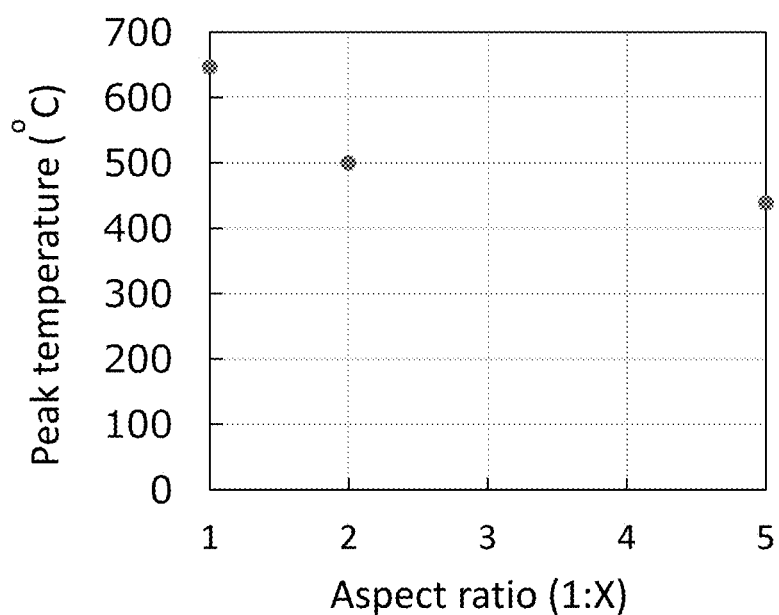
FIG. 11 is a graph showing how maximum transient temperature varied with aspect ratio of the openings containing the bridging contacts, in the simulations of FIGS. 6-9.

FIG. 10 is a graph showing how maximum transient temperature varied over time during the simulations of FIGS. 6-9, for the contact structures having different aspect ratios. FIG. 11 is a graph showing how maximum transient temperature varied with aspect ratio of the openings containing the bridging contacts, in the simulations of FIGS. 6-9. It can be understood from FIGS. 10 and 11 that the maximum transient temperature developed in the contact structure decreases progressively as value n in the aspect ratio 1:n increases above 1. In certain embodiments of the invention the aspect ratio is set to a particularly high value by shaping the openings such that they are elongate slots extending substantially across the entire width of the thin-film top-electrode 107 of the capacitor.

Figure 12A:
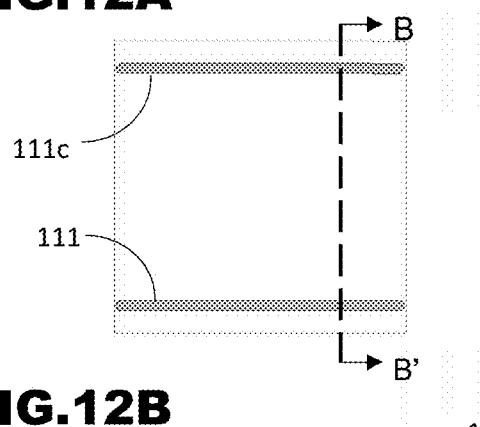
Figure 12B:
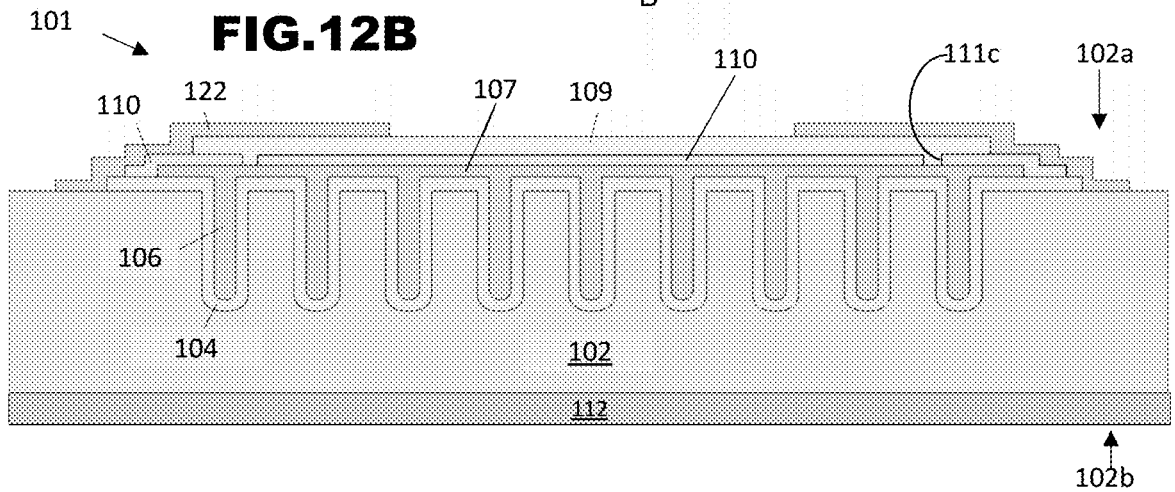

An RC-network component 101 incorporating a new contact arrangement according to an embodiment of the invention will now be described with reference to FIGS. 12A and 12B. FIGS. 12A and 12B illustrate an RC-network component 101 according to an embodiment of the invention that makes use of a pair of openings, for bridging contacts, that span the width of the thin-film top electrode plate of the capacitor. In the illustrated example, the RC-network component 101 is implemented as a monolithic RC-network component (integrated passive device (IPD)). FIG. 12A shows the component 101 in a plan view looking down from above, and FIG. 12B is a cross-sectional view along the line B-B' of FIG. 12A.

As can be seen from FIG. 12A, the monolithic RC-network component 101 comprises a substrate 102. In the example illustrated by FIGS. 12A and 12B, the substrate 102 is a low ohmic semiconductor substrate which defines the bottom electrode of a MIS (metal-insulator-silicon) structure constituting a three-dimensional (3D) capacitor. The 3D capacitor structure is formed over a set of holes which extend from the surface at a first side 102a of the substrate 102 into the bulk of the substrate. It will be understood that, in other embodiments, the 3D capacitor structure may make use of other relief features provided in this surface of the substrate 2 (e.g. trenches, holes, columns, . . . ). It will be understood further that, in other embodiments, the capacitor may be implemented according to the different technologies illustrated in FIGS. 1D-1F.

A continuous dielectric layer 104 is formed over the set of holes and conformally follows the contours of the surface, lining the walls of the holes. The dielectric layer 104 constitutes the dielectric of the 3D capacitor. The top electrode of the 3D capacitor is formed by a conductive material 106 which fills the holes and extends in a thin film 107 at the surface of the substrate. The thin film 107 constitutes a thin-film top electrode of the capacitor. In preferred embodiments of the invention the thickness of the layer 107 constituting the upper electrode is 5 µm or less. In more especially preferred embodiments of the invention the thickness of the layer 107 constituting the upper electrode is 1 µm or less.

A contact plate 109 is provided parallel to the layer 107 of the top capacitor electrode, separated by an insulating layer 110. The contact plate 109 may be used as one terminal (top terminal) of the RC-network component 101. In the illustrated example, the contact plate 109 and the layer 107 of the top capacitor electrode have the same surface area and peripheral shape. If desired, the contact plate 109 and the layer 107 of the top capacitor can have different surface areas from one another and/or different peripheral shapes from one another.

In the RC-network component 101, a set of bridging contacts 108 are formed through the insulating layer 110 and electrically interconnect the layer 107 of the 3D capacitor electrode with the contact plate 109. The number of bridging contacts included in the set may vary between embodiments of the invention. In some embodiments of the invention a single opening/bridging contact may be provided. In other embodiments of the invention two bridging contacts may be provided. In still other embodiments of the invention, three or more than three bridging contacts/openings may be provided.

In the example illustrated in FIGS. 12A and 12B, the set of bridging contacts 108 is constituted by a pair of bridging contacts 108 formed to fill openings 111c each having a peripheral shape generally corresponding to that illustrated in FIG. 5C. In this case, where the openings 111c consist of slots having the general shape illustrated in FIG. 5c, there are no corners where current concentration (and, thus, heat concentration) occur. Moreover, a particularly excellent reduction is obtained in concentration of current, and therefore in reduction of maximum temperature, in the case where the slots span substantially the full width of the thin-film top-electrode 107 of the capacitor (i.e. in the case where the aspect ratio of the openings is made very large). Although FIGS. 12A and 12B relate to an example in which two slots span substantially the full width of the thin-film top-electrode 107 of the capacitor, it will be understood that one such slot, or three such slots, or more than three such slots may be provided.

A conductive layer 112 (backside metallization) is provided on the bottom surface of the substrate 102. The conductive layer 112 constitutes a bottom contact of the RC-network component 101.

In the RC-network component 101 according to the embodiment of the invention represented in FIGS. 12A and 12B, the 3D capacitor structure extends through the substrate in the direction of the substrate's thickness, and opposing electrodes of the 3D capacitor are accessible at opposite sides 102a, 102b of the substrate 102. The resistance of the RC-network component depends on the contact structure at side 102a of the RC-network component, involving the contact plate 109 and the bridging contacts 108, but there may also be a resistance contribution from the bulk substrate 102. However, the contribution made by the substrate 102 may be reduced by employing a low ohmic substrate. For example, to reduce the contribution which the substrate makes to the overall resistance, the substrate may be highly doped so as to be low ohmic. For example, N type silicon may be used having a doping level of the order of $10^{19} cm^{-3}$. Semiconductor materials other than silicon may also be used, e.g. GaAs, with appropriate doping levels so that the substrate is low ohmic.

As another example, in a case where the sheet resistance is 100 Ohms per square, typically the substrate is $n^{++}$ doped so that resistivity of the substrate is set from 1 mOhm.cm to 5 mOhm.cm. Thus, the substrate does not make a significant contribution to the overall resistance of the RC network component. If the sheet resistance is increased (say, to 1kOhm per square) then it is permissible to use a higher ohmic substrate, i.e. a substrate having a lower doping level. Preferably the doping of the substrate is set so that the substrate makes a contribution of no more than 5% (more preferably of the order of 1%) to the resistance of the RC network, while still ensuring that ohmic contact can be made with the backside metallization.

The dielectric layer 104 may be made of a material (or stack of materials) such as $SiO_2$, SiN, $Al_2O_3$, $HfO_2$, a $SiO_2/SiN/SiO_2$ stack etc.

In the example illustrated in FIGS. 12A and 12B the conductive material 106 used to form the top capacitor electrode and the layer 107 is polysilicon. In this case, because the final resistor in the architecture is defined by the sheet resistance of the polysilicon layer, the drift of the resistance value with temperature is the same as for a standard polysilicon process, and can be as low as a few 100 ppm/° C. Furthermore, the absolute accuracy of the resistance is the same as for a standard polysilicon process, i.e. the variation in nominal value in a batch of products can be <10%.

It will be understood that conductive materials other than polysilicon may be used to form the top capacitor electrode, for example, TiN, Si/Ge, etc.

The sheet resistance of the polysilicon top capacitor electrode can be adjusted by appropriate control of the doping of the material forming the top capacitor electrode. The sheet resistance of the top capacitor electrode can be adjusted in the same way in the case where this electrode is made of other semiconductor materials.

The insulating layer 110 may be made of any convenient insulating material. An example material is $SiO_2$ which is selected in view of its ubiquity and the fact that it enables an insulating layer having only moderate stress to be produced, but the invention is not limited to the use of this material. Other materials may be used, including materials such as SiN (assuming that increased stress is acceptable), and less common materials such as BCB (benzocyclobutene).

The bridging contacts 108 may be made of any convenient conductive material. To avoid having a significant impact on the resistance of the finished component, it is advantageous for the bridging contacts to be made of a material having conductivity greater than that of the material forming the top capacitor electrode 107. In the case where the top capacitor electrode 107 is made of polysilicon, an example material that may be used for the bridging contacts is Al—Si—Cu, or aluminum (especially high purity aluminum having low granularity, which facilitates assembly), but the invention is not limited to use of these materials.

The contact plate 109 may be made of may be made of any convenient conductive material. In practice, the nature and dimensions of the plate 109 may be selected taking into account constraints that derive from the process (wire-bonding, ribbon bonding, etc.) that is used to assemble the RC-network component 101 with other components.

In a case where the contact plate 109 is made of the same material as the bridging contacts 108, both elements may be formed in a common manufacturing process, which simplifies fabrication. Also, in a case where the contact plate 109 and bridging contacts 108 are made of the same material there is an improved mechanical and electrical connection between them. The latter property is advantageous because a poor-quality contact to the underlying polysilicon could in itself introduce a contribution to the overall resistance of the component. The layer 112 may be made of one or more conductive layers, such as metals. As one example, the layer 112 may be made of a stack of Ti, Ni and Au (or Al) layers, with the Ti layer improving adhesion to the semiconductor substrate, Ni serving as a barrier layer and Au (or Al) providing good solderability of the component.

A layer 122 covering the ends of the layers 104, 110 and 109 is provided for improving moisture resistance of the structure. This layer 122 may be made of any convenient material, e.g. SiN as for layer 22 in the embodiment illustrated in FIG. 3A.

An example implementation of a method for fabricating an RC-network component 101 such as that of FIGS. 12A-12B will now be described with reference to FIGS. 13 and 14.

Figure 13:
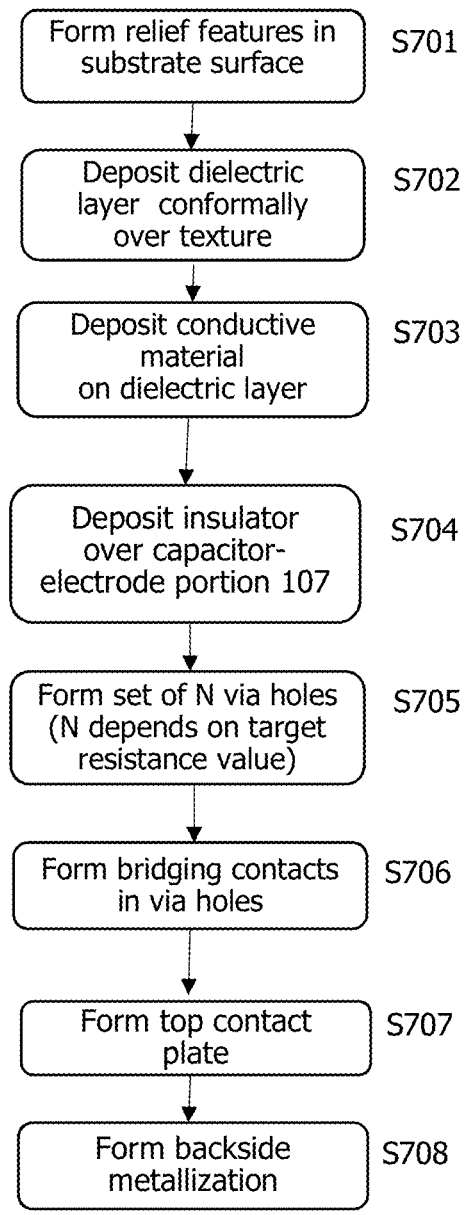
FIG. 13 is a flow diagram illustrating an example method of manufacturing an RC-network component such as that illustrated in FIGS. 12A and 12B.
Figure 14:
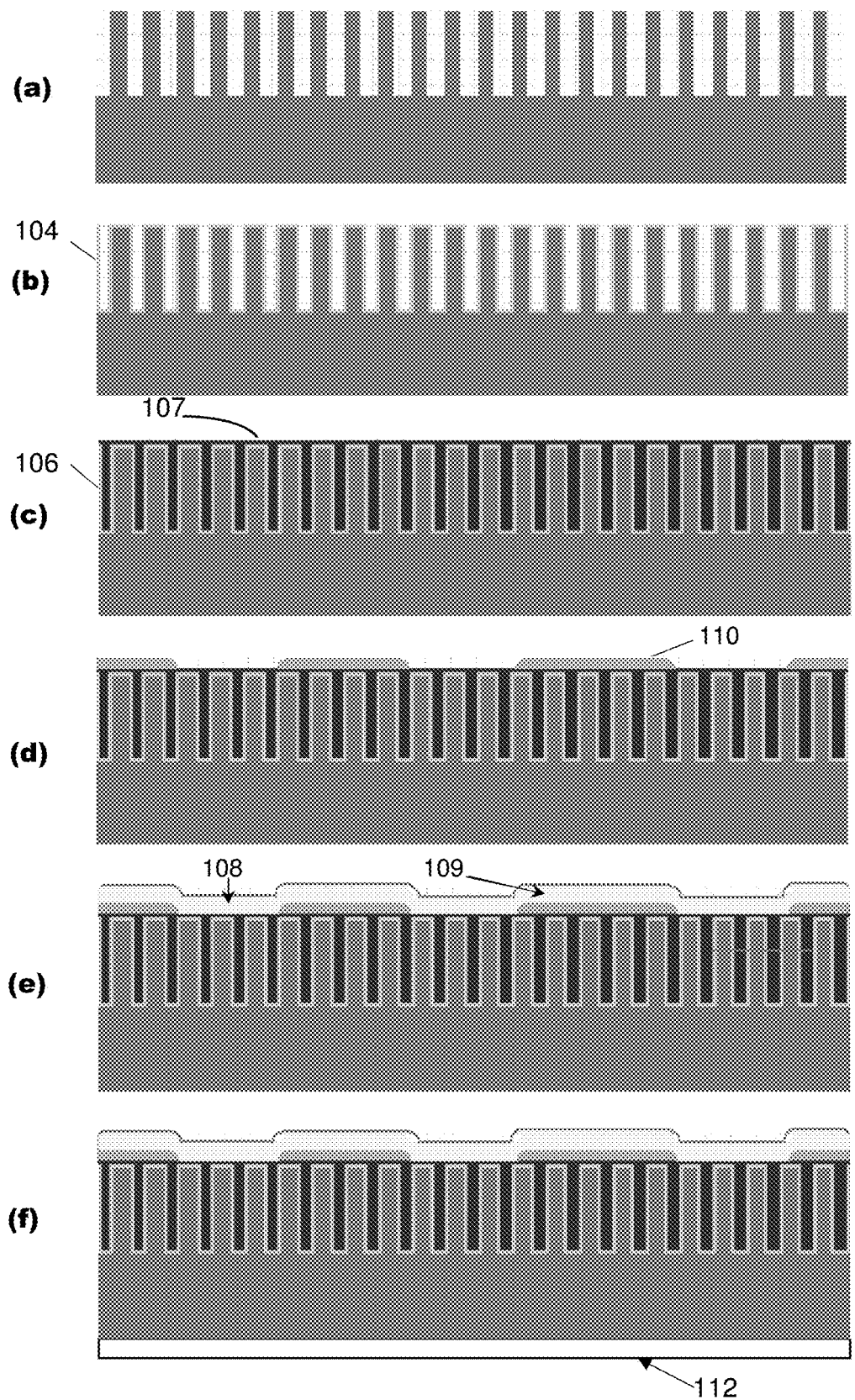
FIG. 14 shows a series of views illustrating the steps of FIG. 13.

It is assumed that a suitably-prepared semiconductor substrate is provided at the start of the method illustrated by FIG. 13. This may be, for example, a low-ohmic (highly-doped) silicon wafer in which multiple RC-network components according to the invention will be fabricated simultaneously. For simplicity, the following description only discusses formation of a single RC-network component intended to be a standalone component. Conventional processes may be used to form the elements of the MIS capacitor structure.

A set of adjacent relief features (e.g. holes, trenches or columns) is created in a surface of the substrate 102 (step S701). The relief features may be created, for example, using masking and etching processes, e.g. DRIE (deep reactive ion etching). Diagram (a) of FIG. 14 represents the substrate after creation of relief features consisting of a set of wells (trenches, holes). Then, dielectric material (e.g. $SiO_2$) is deposited, for example by chemical vapor deposition, atomic layer deposition, etc., and patterned by photolithography and dry etching so as to form the dielectric layer 104 that covers the relief features substantially conformally (step S702). Diagram (b) of FIG. 14 represents the substrate after formation of the dielectric layer 104.

Next, conductive material (e.g. polysilicon) is deposited over the dielectric layer 104, for example by a chemical vapor deposition process, and patterned by photolithography and dry etching so as to form the portion 106 and the thin-film top electrode portion 107 (step S703). Diagram (c) of FIG. 14 represents the substrate after formation of the portions 106 and 107.

An insulating layer 110 is then formed on the capacitor-electrode portion 107 (S504), for example by depositing a layer of $SiO_2$ by a plasma enhanced chemical vapor deposition process, or any other convenient process. A patterning process may then be used (step S705) to create a set of via holes (openings) in the insulating layer. Typically, the patterning process involves photolithography to define the desired shape of the openings 111, followed by dry etching. Diagram (d) of FIG. 14 represents the structure after the insulating layer 110 has been formed and the via holes created.

In this example the peripheral shape of the via-holes is generally rectangular along the majority of their length, with, at each end, a respective portion shaped like an arc of a circle, as for the openings 111c in FIG. 12A.

Next, a set of bridging contacts are formed in the via holes (S706), notably by filling the via holes with a conductive material, e.g. Al, Al—Si—Cu, etc. The conductive material may be deposited by any convenient process, e.g. sputtering, CVD, PVD, etc. A contact plate 109 is then formed on the insulating layer (S707), for example by PVD. The contact plate 109 is electrically connected to the capacitor-electrode portion 107 by the bridging contacts. Diagram (e) of FIG. 14 represents the structure after the bridging contacts and contact plate have been formed. Although FIG. 13 shows the formation of the bridging contacts 108 and the formation of the contact plate 109 as separate processes, it should be noted that these elements may all be formed in a common process.

Finally, the backside of the wafer is ground and a backside electrode 112 is formed on the surface of the substrate opposite to the surface upon which the contact plate 109 is formed (S708). Conventional processes may be used to create the backside metallization. The backside electrode 112 may be made of any convenient material or materials, e.g. a 3-layer structure consisting of Ti/Ni/Au. Diagram (f) of FIG. 14 represents the structure after the backside electrode has been formed. In practice, additional steps may be required, e.g. planarization, dicing the wafer to singulate individual dies, and so on.

Additional Variants

Although the present invention has been described above with reference to certain specific embodiments, it will be understood that the invention is not limited by the particularities of the specific embodiments. Numerous variations, modifications and developments may be made in the above-described embodiments within the scope of the appended claims.

It is to be understood that references in this text to directions and locations, such as "top" and "bottom", merely refer to the directions that apply when architectures and components are oriented as illustrated in the accompanying drawings. Thus, a surface which may be "top" in FIG. 1A would be closest to the ground if the component 1 were to be turned upside down from the illustrated orientation.

The invention claimed is:

1. An integrated RC-network component comprising:
a substrate;
a capacitor having a thin-film top electrode portion at a surface on a first side of the substrate;
an insulating layer on the thin-film top electrode portion of the capacitor;
a contact plate on the insulating layer, and
one or more bridging contacts in openings traversing the insulating layer, the bridging contacts electrically connecting the thin-film top electrode portion of the capacitor to the contact plate,
wherein the RC-network component has first and second contacts, the first contact comprising said contact plate, and a series RC circuit is present between the first and second contacts,
wherein the substrate is a low ohmic doped semiconductor substrate that makes a contribution of no more than 5% to a resistance of the RC-network component,
wherein, in a direction of a thickness of the thin-film top electrode portion of the capacitor, a length of the bridging contacts is sufficiently greater than the thickness of the thin-film top electrode portion that an equivalent series resistance of the capacitor is proportional to a sheet resistance of the thin-film top electrode portion divided by a number of the bridging contacts, and
wherein the openings have an elongated peripheral shape having an aspect ratio greater than 1:1.

2. The RC-network component according to claim 1, wherein the aspect ratio is greater than 2:1.

3. The RC-network component according to claim 1, wherein the openings have a rectangular peripheral shape.

4. The RC-network component according to claim 1, wherein said openings in the insulating layer comprise one, or more than one, elongated opening spanning the thin-film top electrode portion of the capacitor.

5. The RC-network component according to claim 1, wherein the openings have an elliptical peripheral shape.

6. The RC-network component according to claim 1, wherein the bridging contacts are made of a material having conductivity greater than that of a material forming the thin-film top electrode portion.

7. The RC-network component according to claim 6, wherein the bridging contacts and the contact plate are integrally formed of a same material.

8. The RC-network component according to claim 1, wherein the thin-film top electrode portion of the capacitor is made of polysilicon.

9. The RC-network component according to claim 1, wherein the contact plate and the thin-film top electrode portion of the capacitor have a same peripheral shape.

10. The RC-network component according to claim 1, wherein the contact plate and the thin-film top electrode portion of the capacitor have a same size.

11. The RC-network component according to claim 1, wherein the capacitor is a 3D capacitor, and a bottom electrode of the 3D capacitor comprises the low ohmic semiconductor substrate.

12. The RC-network component according to claim 1, wherein an only part of the thin-film top electrode portion to be located at said surface on the first side of the substrate is a single planar sheet comprising said thin-film top electrode portion.

13. A monolithic RC-network component according to claim 1.

14. A method of fabricating an RC-network component, the method comprising:
forming a capacitor having a thin-film top electrode portion at a surface on a first side of a substrate;
forming an insulating layer on the thin-film electrode portion of the capacitor;
forming one or more bridging contacts traversing openings in the insulating layer; and
forming a plate-shaped contact on the insulating layer;
wherein the bridging contacts electrically connect the thin-film top electrode portion of the capacitor to the plate-shaped contact,
wherein the RC-network component has first and second contacts, the first contact comprising a contact plate, and a series RC circuit is formed between the first and second contacts,
wherein the substrate is a low ohmic semiconductor substrate doped to make a contribution of no more than 5% to a resistance of the RC-network component,
wherein, in a direction of a thickness of the thin-film top electrode portion of the capacitor, a length of the bridging contacts is sufficiently greater than the thickness of the thin-film top electrode portion that an equivalent series resistance of the capacitor is proportional to a sheet resistance of the thin-film top electrode portion divided by a number of the bridging contacts, and
wherein the openings in the insulating layer have an elongated peripheral shape having an aspect ratio equal to or greater than 1:1.

* * * * *